United States Patent [19]

Weber

[11] 4,284,489
[45] Aug. 18, 1981

[54] POWER TRANSFER NETWORK

[75] Inventor: Harold J. Weber, Sherborn, Mass.

[73] Assignee: Coulter Systems Corporation, Bedford, Mass.

[21] Appl. No.: 945,805

[22] Filed: Sep. 26, 1978

[51] Int. Cl.³ .............................................. C23C 15/00
[52] U.S. Cl. ...................................... 204/298; 333/32; 315/254; 315/276
[58] Field of Search ..................... 204/298; 333/32-35; 331/74; 315/111, 246, 252, 254, 276; 334/41, 45

[56] References Cited

U.S. PATENT DOCUMENTS

| | | | |
|---|---|---|---|
| 2,665,339 | 1/1954 | Leng | 333/220 X |
| 2,756,393 | 7/1956 | Moulton | 333/27 |
| 3,436,333 | 4/1969 | Beaudry | 204/312 |
| 3,569,777 | 3/1971 | Beaudry | 315/111 |
| 3,704,219 | 11/1972 | McDowell | 204/192 |
| 3,767,551 | 10/1973 | Lang, Jr. et al. | 204/192 |
| 3,803,019 | 4/1974 | Robinson et al. | 204/298 |
| 3,849,283 | 11/1974 | Jackson et al. | 204/298 |
| 3,892,650 | 7/1975 | Cuomo et al. | 204/192 |

OTHER PUBLICATIONS

Frederick E. Terman, Radio Engineers Handbook, McGraw-Hill Book Co., Inc., New York, 1943, p. 148.

Primary Examiner—Delbert E. Gantz
Assistant Examiner—William Leader
Attorney, Agent, or Firm—Silverman, Cass & Singer, Ltd.

[57] ABSTRACT

A power transfer network for efficiently coupling a source of high frequency energy to a physically large dimensioned electrode system in a sputtering machine which exhibits high spray capacitance to ground. The network includes an inductive element capable of being tapped along its length such as a linear line section and a tuning capacitor with the source of high frequency energy in the megahertz range, each of the source and the electrode system being connectively tapped into a suitable location along the inductive element.

17 Claims, 4 Drawing Figures

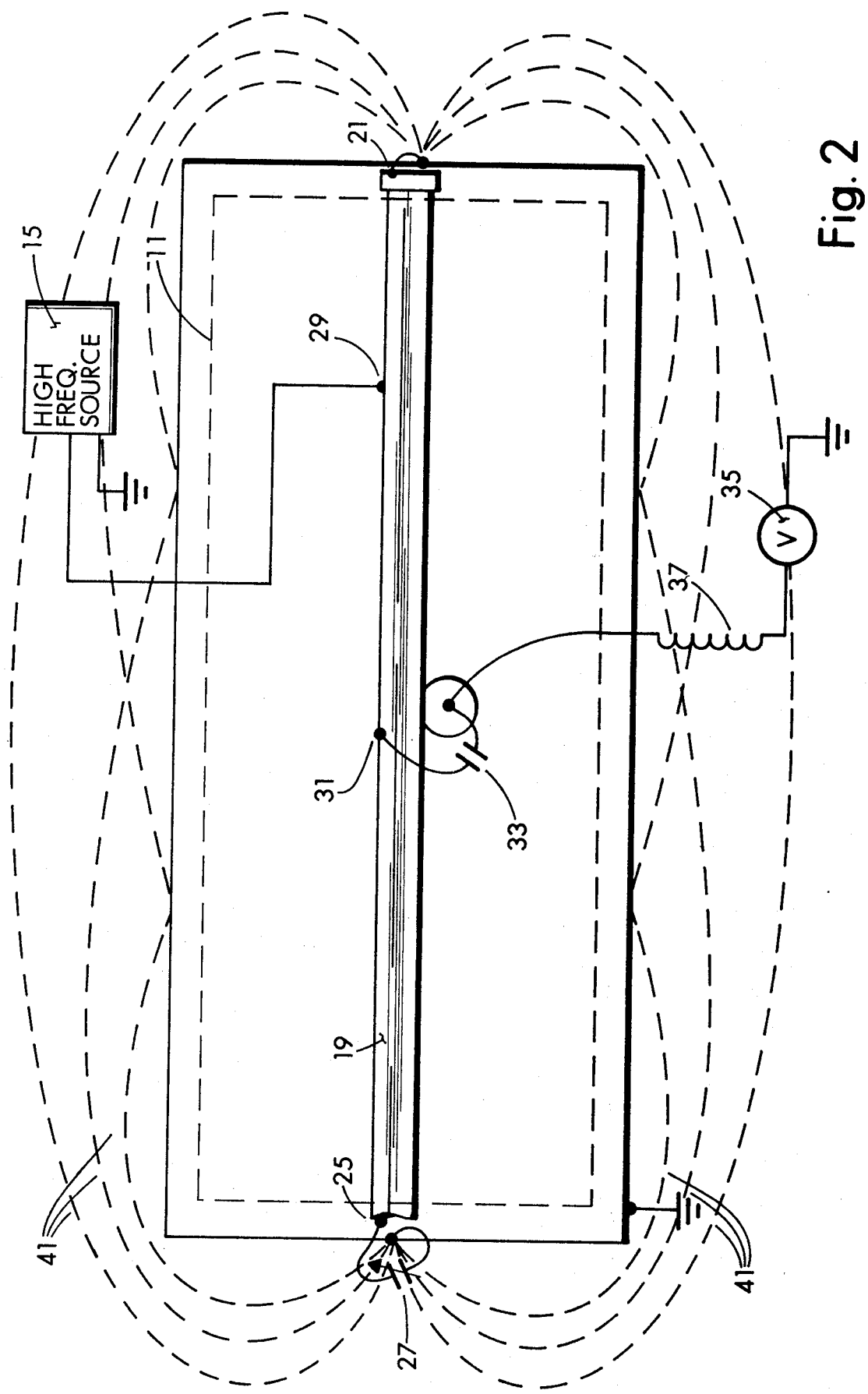

4,284,489

POWER TRANSFER NETWORK

BACKGROUND OF THE INVENTION

This invention relates to a power transfer network and, more particularly, to a power transfer network for transferring high frequency energy from a source to an electrode in a sputtering machine.

Sputtering machines and the use of such machines to form thin films of material are now well known in the art. Such machines usually include one or more electrodes which are designed and arranged to function as cathodes or targets and one or more electrodes which are designed and arranged to function as anodes. The electrical energy employed to excite or drive the machine is normally connected to the targets while the anodes are maintained at or near ground potential.

The use of high frequency, say radio frequency, energy to excite or drive the targets is also well known in the art; this type of energy being necessary to achieve sputtering deposition with certain types of target materials and certain types of substrate materials. The high frequency energy is usually between 1 MHz and 40 MHz. In order to achieve maximum power transfer of the energy from the source to the targets it is the common practice to transfer the energy through a network comprising a resonant L-C circuit.

One type of power transfer network that has been employed in the past includes a coil and a capacitor connected in series resonance and coupled between the source and the target. Generally satisfactory performance has been realized with this network when used with relatively small targets sized around 10 square centimeters and exhibiting stray capacitance to ground of no more than around 100 picofarads and excited at typical 13.56 MHz and at power levels necessary to achieve a desired sputtering rate.

One of the attendant problems with this type of power transfer network is that it will not achieve very efficient power transfer when used with a larger sized electrode which exhibits stray, or parasitic, capacitance to ground of around 200 picofarads or higher.

This problem of relatively high capacitance is further compounded as a difficult-to-drive electrode condition by the decrease in the amount of inductive component (for example, coil, etc.) which can practically be used to bring about resonance. This diminished size and nature of the inductive component severely limits the way it is necessarily connected to the source, the sputtering electrode (target) and the tuning capacitor.

Another significant problem with this type of power transfer network is that it will not produce equipotent field distribution around the sputter electrode if the electrode is relatively large in size, that is, has dimensions on the order of 10 cm by 80 cm, or larger. This is due in part to the small physical size and shape of the inductor which serves to limit the position and connection of the coil as a lumped inductance in relation to the sputtering electrode. In addition, the imbalance as brought about by the relatively linear inductance value distributed in the body of the sputter electrode when configured as a relatively large, and particularly as an elongate sputter electrode.

For certain types of applications it is highly desirable to employ electrodes, say targets, of large physical dimensions, which, because of their extended size will exhibit large parasitic, or stray, capacitance to ground. From an economic standpoint it is important that power be transferred to these targets with a high degree of efficiency and from a performance standpoint it is important that the targets be excited with particular uniformity over their surface area.

An example of a sputtering machine in which the targets are driven by RF energy can be found in U.S. Pat. No. 4,014,779 to M. R. Kuehnle and an example of a power transfer network comprising a coil connected in series with a tuning capacitor and coupled between an RF source and target in a sputtering machine can be found in U.S. Pat. No. 4,025,339 to M. R. Kuehnle.

SUMMARY OF THE INVENTION

A power transfer network constructed according to this invention for connecting a high frequency energy source to an electrode in a sputtering machine includes a resonant linear line section and a tuning capacitor with the HF energy source and the sputtering electrode each being connected to the linear line section which functions as a single inductor autotransformer.

Two embodiments of the invention are described, one for connecting the RF energy source to a single, independently operative electrode and the other for connecting the HF source to a plurality of interactive electrodes. The preferred embodiment for use with a single electrode includes a linear line section and tuning capacitor as hereinbefore described. The embodiment for use with a plurality of electrodes includes a separate linear line section and tuning capacitor combination for each electrode.

IN THE DRAWINGS

In the drawings wherein like reference numerals represent like parts:

FIG. 2 is a plan view of the embodiment shown in FIG. 1;

DESCRIPTION OF PREFERRED EMBODIMENTS

Figure 1:
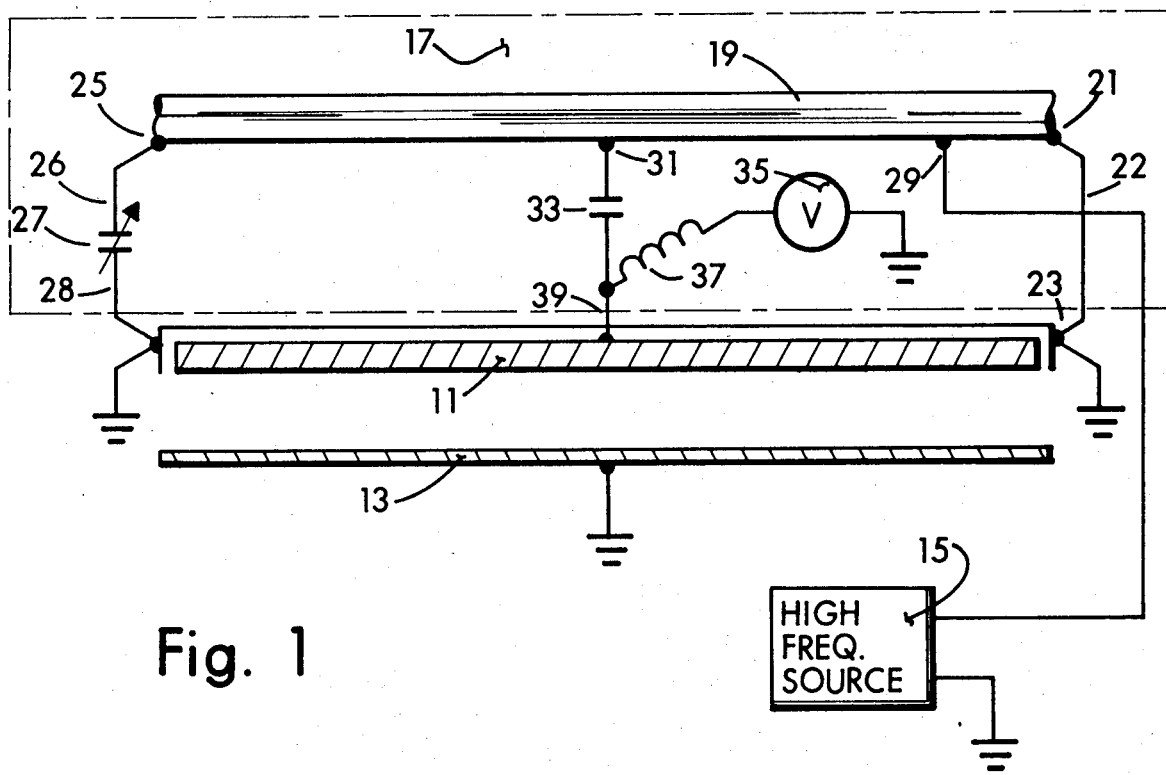
FIG. 1 is a front elevation partly in schematic form and partly in section of a power transfer network constructed according to the invention and connected between a high frequency source and a sputtering machine target.

Referring now to the drawings, and in particular to FIGS. 1 and 2, there is shown a sputtering machine target 11, a sputtering machine anode 13 which is connected to ground, a high frequency power source 15 which is connected at one end to ground, and a power transfer network for transferring energy from source 15 to target electrode 11.

Power transfer network includes a linear line section, or linear inductance, 19 which may be conveniently in the form of a length of copper tubing of circular cross section but may be in coil form for a target electrode that is not as long and narrow as indicated. One end 21 of the linear line section 19 is connected by a conductive element 22 to a grounding shield 23 surrounding target electrode 11 and the other end 25 of linear line section 19 is connected by a conductive element 26 to one end of a tuning capacitor 27, the other end of tuning capacitor 27 is connected by a conductive element 28 to grounding shield 23. Source 15 is tapped down on linear line section 19 at junction 29 and target 11 is tapped down at line section 19 at junction 31 through a DC blocking capacitor 33.

A voltmeter 35 may be connected through a choke 37 to the lead 39 connecting capacitor 33 to target 11 for measuring the self-rectified DC voltage appearing on target 11.

When the network is resonated, the energy field lines 41 for the circulating current, as can be seen in FIG. 2, very nearly encompass and, importantly, serve to symmetrically surround target 11. It is to be understood, of course, that voltmeter 35 is only an aid for measuring the DC voltage and as such is not a component part of the network. Also blocking capacitor need not be coupled between target 11 and linear line section 19 but could, if desired, be just as effectively coupled between anode 13 and ground. The role of the blocking capacitor 33 is to prevent self-rectified d.c. from shorting to ground and as such plays no significant part in the resonant condition of the circuit. The capacitor 33 could be eliminated and replaced with a direct connection if no d.c. is expected to be produced across the target 11 to the anode 13. While such a condition is not typical of the usual sputtering apparatus application for which the circuit herein is especially intended, the fact that resonance is achieved without the capacitor 33 indicates the substantial independence of the resonant circuit on the presence of the capacitor 33.

Figure 3:
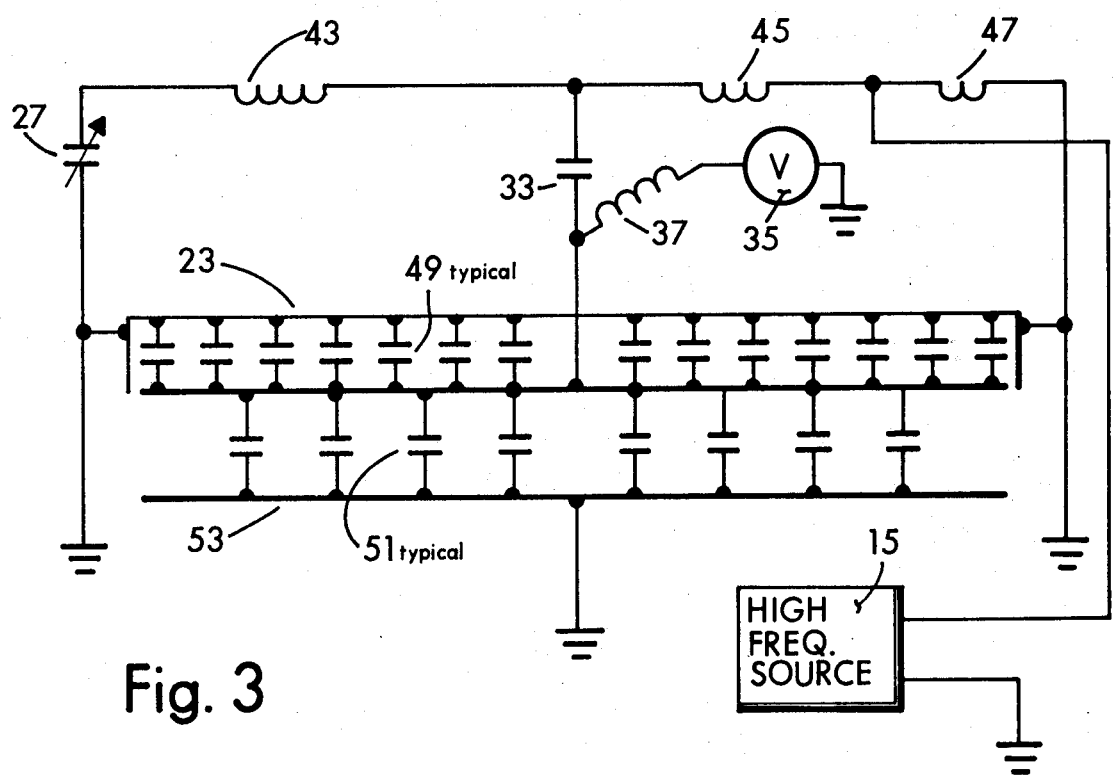
FIG. 3 is an equivalent electrical circuit of the embodiment of the invention shown in FIG. 1.

In the equivalent electrical circuit of the FIG. 1 embodiment as shown in FIG. 3, the linear inductance 19 is represented by a series of coils 43, 45 and 47. Target 11 is shown in relationship to ground shield 23 showing the very substantial stray, or parasitic, residual capacitance 49 appearing therebetwixt. In addition, some lesser stray capacitance 51 occurs between the target 11 and the anode 13 or substrate 53 if a substrate is mounted on the anode. What this shows is that, in usual practice, stray capacitance 49 dominates stray capacitance 51. For large sized targets this may be around 300 picofarads or higher.

Key to the improvement taught in this invention is the adjustment of loaded "Q". Through skilled combination of the target tap location, combined with overall inductor dimension, say length, the most effective L-C ratio can be accomplished for any chosen high frequency. The large diameter tuned line permits substantially higher unloaded "Q" due in part to reduced skin effect losses thereby leading to excellent circuit efficiency when subsequently loaded and operating as a power transfer network.

Furthermore, by using a linear line section as an inductance and then tapping down on the inductance, the overall length of the physical line may be provided to be at least as large as the lengthwise dimension of the target. This will result in a more nearly uniform distribution of the field lines around the target surface.

Representative values and dimensions of the component parts of power transfer network 17 when coupled between an HF power source operating at a typical Industrial, Scientific and Medical frequency, as assigned by the Federal Communications Commission, of 13.56 MHz and a target electrode whose dimensions are 12.5 cm by 87 cm and whose stray capacitance to ground is about 300 picofarads are as follows:

Linear Line Section: 2.2 cm in diameter, 115 cm long

Figure 4:
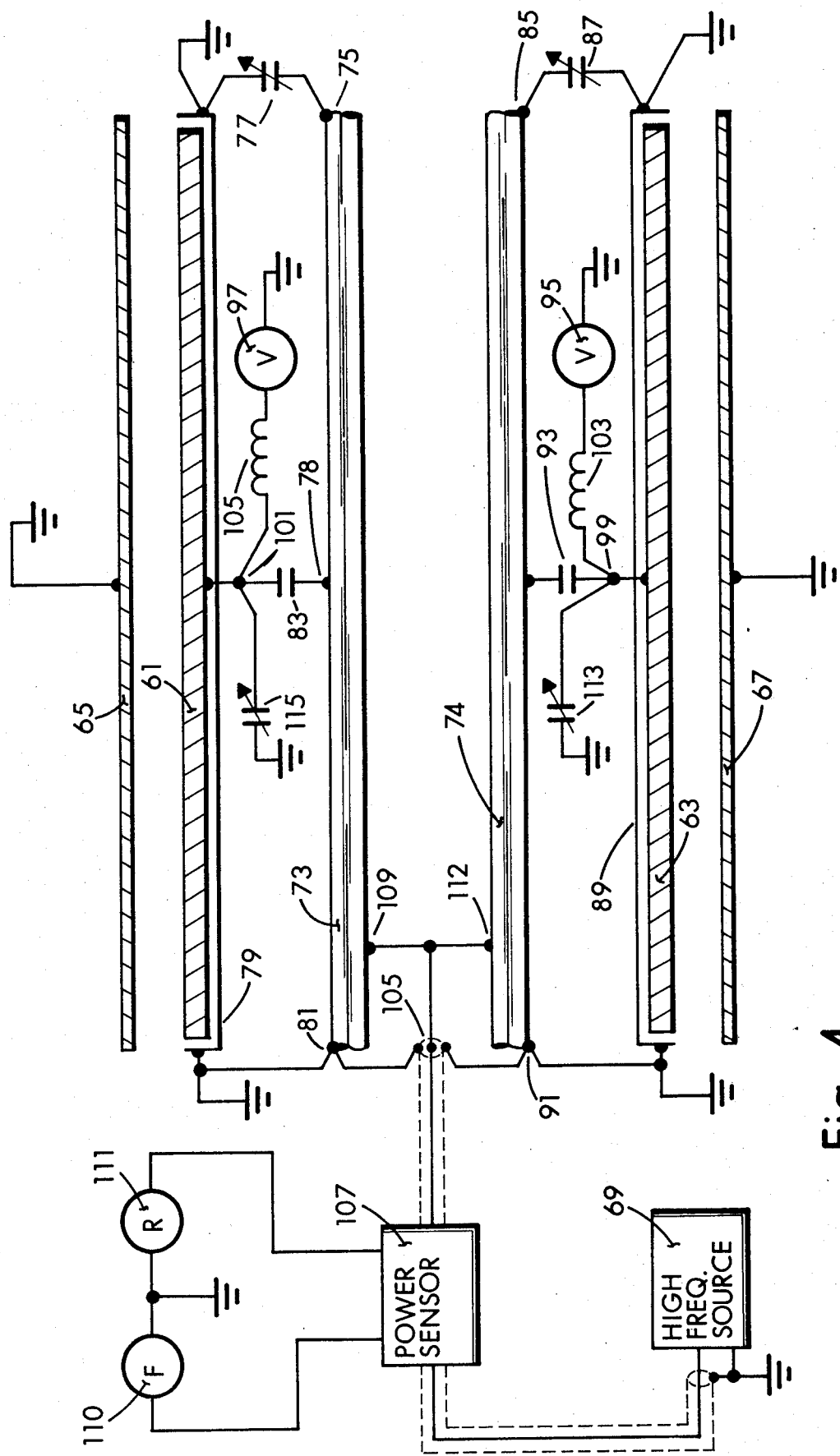
FIG. 4 is a plan view partly in schematic form and partly in section of a power transfer network constructed according to the invention and connected between an HF source and a plurality of sputtering machine targets.

Tunable Capacitor Setting: 75 PF
Blocking Capacitor: 2NF/5 KV DC
Distance from Junction 29 to End 21: 13.4 cm Referring now to FIG. 4, there is illustrated a pair of targets 61 and 63, a pair of anodes 65 and 67, which are connected to ground, a high frequency power source 69 to targets 61 and 63.

The power transfer network includes a pair of linear line sections 73 and 74 which are similar to linear line section 19, linear line section 73 being arranged to supply power to target 61 and linear line section 74 being arranged to supply power target 63.

One end 75 of linear line section 73 is coupled through a tuning capacitor 77 to a grounding shield 79 surrounding target 61. The other end 81 of linear line section 73 is connected to ground. Target 61 is coupled through a d.c. blocking capacitor 83 to linear line section 73 at about midpoint location 78 along its overall length.

One end 85 of linear line section 74 is coupled through a tuning capacitor 87 to a grounding shield 89 surrounding target electrode 63. The other end 91 of linear line section 74 is connected to ground. Target 63 is coupled through a blocking capacitor 93 to linear line section 74 at an intermediate location 94 along its length. The self-rectified voltages at targets 61 and 63, respectively, are optionally measured through voltmeters 95 and 97 which are connected to the leads 99 and 101, respectively, through chokes 103 and 105, respectively.

Energy from power source 69 is coupled to junction 105 through a power sensor 107, such as for example Bird Electronic Corporation Model 4230-053. Junction 105 is coupled to locations 109 and 112, respectively, on linear line sections 73 and 74. Power sensor 107 has terminals which are connected to meters 110 and 111 which provide an indication of forward, or incident and reverse, or reflected, power, respectively.

A balancing capacitor 115 is coupled between target 61 and linear line section 73 and a balancing capacitor 113 is coupled between target 63 and linear line section 75. These balancing capacitors serve to supplement the target capacitance and can be used either to drive the two targets in an unbalanced manner or to compensate for unequal stray capacitance in the several targets.

Representative values and dimensions of the component parts of power transfer network according to this invention when coupled between an RF power source operating at a frequency of 13.56 MHz and a pair of target electrodes whose length and width dimensions are each around 90 cm by 10 cm and each exhibiting a stray capacitance to ground of around 300 picofarads are as follows:

Linear Line Sections (73, 74): 2.2 cm in diameter, 111.7 cm long
Settings on Tunable Capacitors: 85 picofarads
Blocking Capacitors (83, 93): 2 nanofarads
Power at Junction 105: 2800 watts
DC voltage at either meter 95 or 97: −1500 volts
Impedance at operating frequency between junction 105 and ground: 50 ohms
Distance from Junctions 109 and 112 to ends 81 and 91, respectively, in ohms and cm: 100 ohms, 21.6 cm
Distance from Junctions 78 and 94 to ends 75 and 85, respectively, in cm: 68.6 cm Although the preferred embodiment is shown to include the target connected at some mid position along the length of the line while one end of the line is grounded, the artisian is also able to practice the teachings of the invention by transposing the connections. This is to say, the ground is connected to the mid position whereas the target is connected to the previously grounded end of the line. In the aforesaid preferred connection, the tuned line represents a shortened quarter-wave resonant line, while in this alternate connection the line more closely represents a shortened half-wave resonant line and is, therefore, somewhat longer in overall length. It is furthermore to be understood that longer resonant linear lines of three-quarter wavelength, full wavelength and so on are merely operative extensions of either the quarter-wave or half-wavelength linear line.

Also it is to be understood that the invention may be used for driving more than two targets by suitable adjustment of the feedpoints on the linear line sections connected to the junction connected to the source.

While there has been described what is considered to be preferred embodiments of the invention it will be obvious to those skilled in the art that various changes and modifications may be made therein without departing from the invention as called for in the appended claims.

What is claimed is:

1. Apparatus for supplying power efficiently to the discharge plasma load in a sputtering machine by means of r.f. energy of a predetermined frequency in the megahertz range and wherein there is an electrode configuration including target means having a relatively large area and metallic surroundings which are grounded, the stray capacitance of the target means to the surroundings being greater than the order of about 200 picofarads whereby the plasma load has a resistance parallel with the stray capacitance which is substantially greater than the capacitive reactance of the stray capacitance, said apparatus including:
   A. a source of megahertz r.f. power having a relatively low impedance at its output of the same order as the capacitive reactance of the stray capacitance,
   B. a load network between the source and the electrode configuration, said configuration including said target means and substrate supporting anode means at substantially ground potential, said load network comprising
      i. a parallel resonant circuit including a single inductor autotransformer which is formed of conductive tubing,
      ii. a first portion of the autotransformer including at most all of the inductor and being connected to a variable tuning capacitor having one plate thereof connected to one end of the first portion, the other plate connected to ground potential and the other end of the first portion connected to ground potential,
      iii. a second portion of the autotransformer including less than all of the inductor and defined by an output tap on the inductor and the end of the first portion connected to ground potential, means including a d.c. blocking element and a coupling line extending from said output tap to said target means whereby the stray capacitance is connected in parallel with said second portion of the autotransformer,
      iv. said parallel resonant circuit being in resonance at the source frequency with the capacitive reactance of the tuning capacitor and stray capacitance balancing the inductive reactance of that part of the transformer participating in the parallel resonant circuit, and
   C. an input tap on the inductor and the source being coupled to said input tap, the location of said input tap relative to the inductor being chosen to provide proper impedance match between the source and the parallel resonant circuit, the location of the output tap being chosen to provide the proper impedance match for the plasma of the sputtering machine when operating at a voltage for effective sputtering.

2. The apparatus as claimed in claim 1 in which the first portion of the transformer includes substantially all of the inductor, one end of the inductor being connected to ground potential, the other end of the inductor being connected to the second plate of the tuning capacitor.

3. The apparatus as claimed in claim 1 in which the first portion of the transformer includes substantially less than all of the inductor.

4. The apparatus as claimed in claim 2 in which the input and output taps are spaced apart voltage-wise and respectively spaced voltage-wise from the ends of the inductor.

5. The apparatus as claimed in claim 2 in which the input and output taps are common.

6. The apparatus as claimed in claim 3 in which the connections of the transformer are such that the stray capacitance and the tuning capacitor are connected across different parts of the inductor.

7. The apparatus as claimed in claim 3 in which the output tap is connected at one end of the inductor, the second plate of the tuning capacitor is connected to the second end of the inductor, the approximate center of the inductor is connected at ground potential and the input tap is located between said approximate center and the output tap.

8. The apparatus as claimed in claim 1 in which the inductor is a rectilinear line section.

9. The apparatus as claimed in claim 2 in which the inductor is a rectilinear line section.

10. The apparatus as claimed in claim 3 in which the inductor is a rectilinear line section.

11. The apparatus as claimed in claim 8 in which the effective length of the rectilinear line section is at least as long as the longitudinal dimension of the target means.

12. The apparatus as claimed in claim 9 in which the effective length of the rectilinear line section is at least as long as the longitudinal dimension of the target means.

13. The apparatus as claimed in claim 10 in which the effective length of the rectilinear line section is at least as long as the longitudinal dimension of the target means.

14. Apparatus for supplying power efficiently to the discharge plasma loads in a sputtering machine by means of r.f. energy of a predetermined frequency in the megahertz range and wherein there is an electrode configuration including a plurality of targets each having a relatively large area and metallic surroundings that are grounded, the stray capacitance of each target to the surroundings being greater than the order of about 200 picofarads whereby the plasma load of each target has a resistance parallel with its stray capacitance which is substantially greater than the capacitive reactance of its respective stray capacitance, said apparatus including:

A. a source of megahertz r.f. power having a relatively low impedance at its output of the same order as the capacitance reactance of the stray capacitance of each target, B. a load network between the source and each target, there being as many networks as targets and the electrode configuration comprising substrate supporting anode means at substantially ground potential opposite the targets, each load network comprising i. a parallel resonant circuit including a single inductor autotransformer which is formed of conductive tubing, ii. a first portion of the autotransformer including at most all of the inductor and being connected to a variable tuning capacitor having one plate thereof connected to one end of the first portion, the other plate connected to ground potential and the other end of the first portion connected to ground potential, iii. a second portion of the autotransformer including less than all of the inductor and defined by an output tap on the inductor and the end of the first portion connected to ground potential, means including a d. c. blocking element and a coupling line extending from said output tap to the target served by said load network whereby the stray capacitance of said target is in parallel with the said second portion of said autotransformer, iv. said parallel resonant circuit being in resonance at the source frequency with the capacitive reactance of the tuning capacitor and stray capacitance balancing the inductive reactance of that part of the transformer participating in the parallel resonant circuit and C. each inductor having an input tap and the source being coupled to all of the said input taps, the location of each input tap relative to its inductor being chosen to provide proper impedance match between said source and the parallel resonant circuit including said last-mentioned inductor, the location of each output tap relative to its inductor being chosen to provide the proper impedance match for the plasma generated by the targets being served by the particular resonant circuit which includes said inductor when operated at a voltage for effective sputtering.

15. The apparatus as claimed in claim 14 in which each of the inductors comprises a rectilinear line section.

16. The apparatus as claimed in claim 14 in which means are provided for balancing differences in the electrical parameters of the respective targets.

17. Apparatus for supplying power efficiently to the discharge plasma load in a sputtering machine by means of r.f. energy of a predetermined frequency in the megahertz range which comprises:

A. a source of megahertz r.f. power having a relatively low impedance at its output, B. electrodes of the type adapted to function as cathode means and anode means during the sputtering process to produce a sputtering plasma between them, C. a sputtering machine having the said electrodes mounted therein and including grounded metallic structure in the vicinity of the cathode means, the input impedance of said electrode means being established primarily by the resistance of the plasma between the electrodes during operation and the stray capacitance between the cathode means and grounded metallic structure, the said stray capacitance having a value of 200 picofarads or more, the resistance of the plasma being greater than the capacitive reactance of the stray capacitance and greater than the impedance of said source, the plasma resistance and the stray capacitive reactance being in parallel whereby any power applied between the electrodes will be principally taken by the stray capacitive reactance unless prevented, D. means for coupling said source to said electrodes to transfer power from said source to said plasma efficiently which comprises a load network having an input terminal and an output terminal and a coupling line extending from said output terminal to said cathode means, the source being coupled to said input terminal, said network comprising:

i. a parallel resonant circuit including a single inductor autotransformer which is formed of conductive tubing, ii. a first portion of the autotransformer including at most all of the inductor and being connected to a variable tuning capacitor, said tuning capacitor having one plate thereof connected to one end of the first portion, the other plate connected to ground potential and the other end of the first portion connected to ground potential, iii. a second portion of the autotransformer including less than all of the inductor and defined by said output terminal and the end of the first portion connected to ground potential and being connected in parallel with said stray capacitance by virtue of the connection of the coupling line between said output terminal and said cathode means, iv. said parallel resonant circuit being in resonance at the source frequency with the capacitive reactance of said tuning capacitor and stray capacitance balancing the inductive reactance of that part of the transformer participating in the parallel resonant circuit, E. the said input and output terminals being taps on said transformer and the said source being connected to the input terminal tap, the location of the input terminal tap relative to the inductor being chosen to provide the proper impedance match between the source and load network, the location of the output terminal tap being chosen to provide the proper impedance match for the plasma of the sputtering machine when operating, at a voltage for effective sputtering action.

* * * * *